(12) United States Patent
Huang et al.

(10) Patent No.: US 11,322,489 B2
(45) Date of Patent: May 3, 2022

(54) TILED DISPLAY DEVICE

(71) Applicant: InnoLux Corporation, Miao-Li County (TW)

(72) Inventors: Hao-Jung Huang, Miao-Li County (TW); Chao-Chin Sung, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 78 days.

(21) Appl. No.: 16/723,095

(22) Filed: Dec. 20, 2019

(65) Prior Publication Data

US 2020/0251457 A1 Aug. 6, 2020

Related U.S. Application Data

(60) Provisional application No. 62/799,047, filed on Jan. 31, 2019.

(30) Foreign Application Priority Data

Oct. 11, 2019 (CN) .......................... 201910963323.3

(51) Int. Cl.
*H01L 25/13* (2006.01)
*G09G 3/32* (2016.01)
(Continued)

(52) U.S. Cl.
CPC .............. *H01L 25/13* (2013.01); *G09G 3/32* (2013.01); *H01L 23/4985* (2013.01); *H01L 33/62* (2013.01)

(58) Field of Classification Search
CPC ..... H01L 25/13; H01L 23/4985; H01L 33/62; H01L 25/0753; G09G 3/32; G09F 9/3026;
(Continued)

(56) References Cited

U.S. PATENT DOCUMENTS

2010/0277064 A1* 11/2010 Cok .................... H01L 27/3293
313/506
2010/0279742 A1* 11/2010 Miyashita ........... H04M 1/0266
455/566

(Continued)

FOREIGN PATENT DOCUMENTS

CN 208240676 U 12/2018
CN 109326226 A 2/2019
(Continued)

OTHER PUBLICATIONS

European Search Report dated Jun. 5, 2020, issued in application No. EP 20150183.0.

(Continued)

*Primary Examiner* — Charles D Garber
*Assistant Examiner* — S M Sohel Imtiaz
(74) *Attorney, Agent, or Firm* — McClure, Qualey & Rodack, LLP

(57) ABSTRACT

A tiled display device is provided. The tiled display device includes a first substrate, a second substrate and a light-emitting unit. The first substrate includes a first main substrate and a first flexible substrate. The first flexible substrate is disposed on the first main substrate. The second substrate is disposed adjacent to the first substrate. The light-emitting unit is disposed on the first flexible substrate. In addition, a portion of the light-emitting unit protrudes from an edge of the first main substrate.

18 Claims, 12 Drawing Sheets

(51) Int. Cl.
*H01L 23/498* (2006.01)
*H01L 33/62* (2010.01)

(58) Field of Classification Search
CPC ... H05K 2201/10128; H05K 2201/056; H05K 2201/10106; H05K 1/189
See application file for complete search history.

(56) References Cited

U.S. PATENT DOCUMENTS

| | | | |
|---|---|---|---|
| 2011/0057861 A1* | 3/2011 | Cok | H01L 51/5209 |
| | | | 345/1.3 |
| 2016/0170443 A1* | 6/2016 | Namkung | G06F 3/041 |
| | | | 359/483.01 |
| 2016/0319997 A1* | 11/2016 | Yamada | F21K 9/23 |
| 2017/0294479 A1* | 10/2017 | Cha | H01L 33/507 |
| 2017/0351475 A1* | 12/2017 | Meersman | H05K 1/028 |
| 2018/0151664 A1* | 5/2018 | Bower | G06F 3/0412 |
| 2018/0211945 A1* | 7/2018 | Cok | G09G 3/32 |
| 2018/0356686 A1 | 12/2018 | Yeh | |
| 2019/0043940 A1 | 2/2019 | Lee et al. | |

FOREIGN PATENT DOCUMENTS

| | | |
|---|---|---|
| CN | 110325005 A | 10/2019 |
| EP | 3 547 366 A1 | 10/2019 |

OTHER PUBLICATIONS

Chinese Language Office Action dated Jun. 25, 2021 for the corresponding application No. CN 201910963323.3.

* cited by examiner

TILED DISPLAY DEVICE

CROSS REFERENCE TO RELATED APPLICATIONS

This application claims priority of U.S. Provisional Patent Application No. 62/799,047 filed on Jan. 31, 2019, and Chinese Patent Application 201910963323.3, filed on Oct. 11, 2019, the entirety of which are incorporated by reference herein.

BACKGROUND

Technical Field

The present disclosure relates to a tiled display device, and in particular it relates to a tiled display device having a better connection space.

Description of the Related Art

Electronic products equipped with display panels have become indispensable necessities in modern society. With the flourishing development of these portable electronic products, consumers have high expectations regarding their quality, functionality, and price.

Mini light-emitting diode technology is a flat panel display technology that has emerged in recent years. Mini light-emitting diode display devices can produce seamless images with wide viewing angles, high brightness, and high contrast. However, when mini light-emitting diode technology is applied to a large-sized display panel, most of them need to be tiled together to achieve a display function. As the requirements for resolution increase, the pitch between the mini light-emitting diodes decreases, which also limits the available space at the connection position of the panel.

Although currently existing tiled display devices have been adequate for their intended purposes, they have not been satisfactory in all respects. Therefore, the development of the structural design that can improve the quality or reliability of tiled display devices is still one of the goals that the industry is currently aiming at.

SUMMARY

In accordance with some embodiments of the present disclosure, a tiled display device is provided. The tiled display device includes a first substrate, a second substrate and a light-emitting unit. The first substrate includes a first main substrate and a first flexible substrate. The first flexible substrate is disposed on the first main substrate. The second substrate is disposed adjacent to the first substrate. The light-emitting unit is disposed on the first flexible substrate. In addition, a portion of the light-emitting unit protrudes from an edge of the first main substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
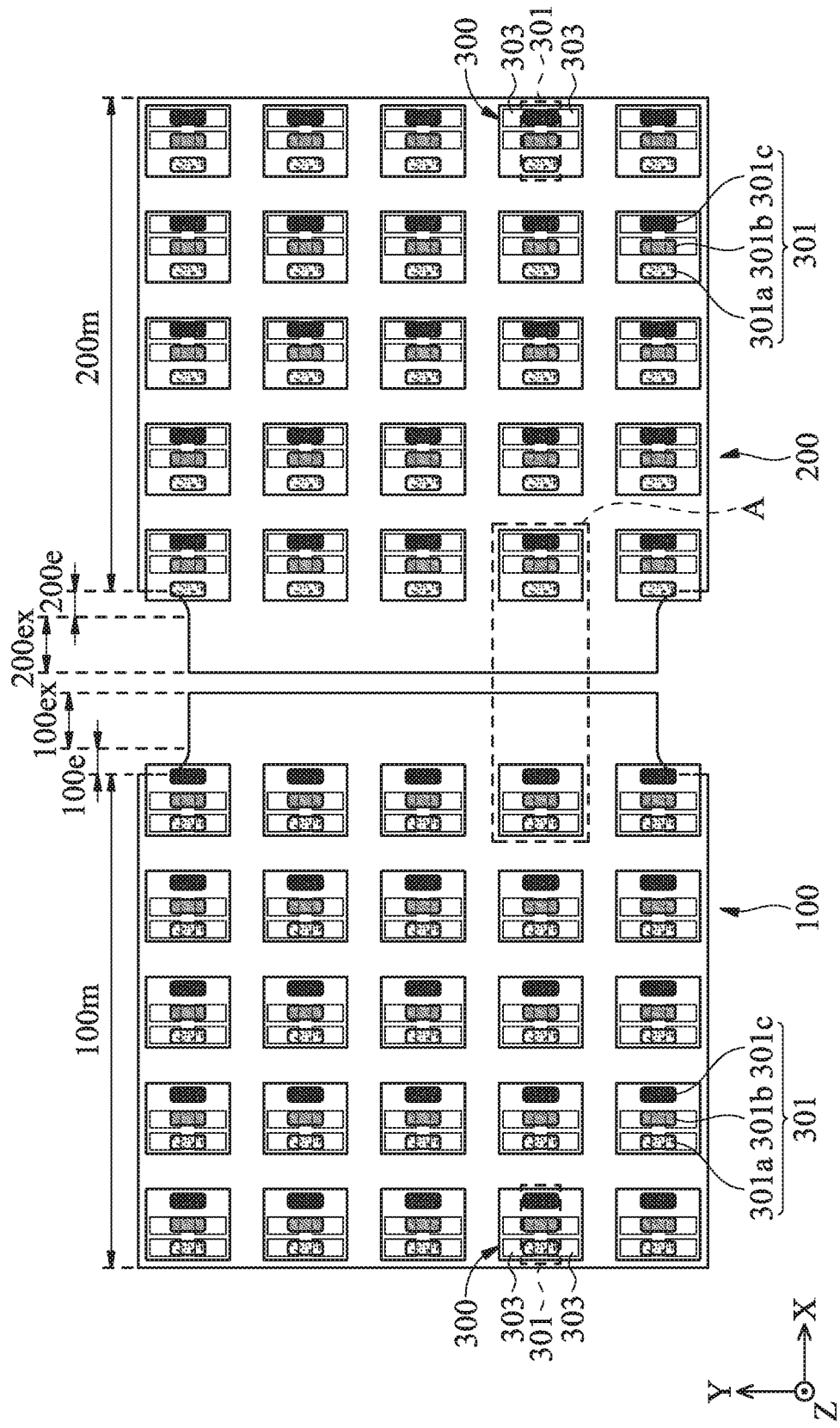
FIG. 1A is a top-view diagram of the tiled display device in accordance with some embodiments of the present disclosure.

The structure of the tiled display device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be understood that the elements or devices in the drawings of the present disclosure may be present in any form or configuration known to those with ordinary skill in the art. In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher". It should be understood that the descriptions of the exemplary embodiments are intended to be read in connection with the accompanying drawings, which are to be considered part of the entire written description. The drawings are not drawn to scale. In addition, structures and devices are shown schematically in order to simplify the drawing.

In addition, the expressions "a first material layer is disposed on or over a second material layer" may indicate that the first material layer is in direct contact with the second material layer, or that the first material layer is not in direct contact with the second material layer, there being one or more intermediate layers disposed between the first material layer and the second material layer.

It should be understood that, although the terms first, second, third etc. may be used herein to describe various elements, components, or portions, these elements, components, or portions should not be limited by these terms. These terms are only used to distinguish one element, component, or portion from another element, component, or portion. Thus, a first element, component, or portion discussed below could be termed a second element, component, or portion without departing from the teachings of the present disclosure.

In some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, in the provided tiled display device, the bendable area of the flexible substrate may be increased by the design of the connection pad or the packaging structure of the light-emitting unit. Accordingly, the risk of disconnection of wirings at the bending portion of the flexible substrate may be reduced, or the impact on the panel resolution at the connection positions of the panels may be reduced.

Refer to FIG. 1A, which is a top-view diagram of a tiled display device 10A in accordance with some embodiments of the present disclosure. It should be understood that FIG. 1A only illustrates some components of the tiled display device 10A for clarity. In addition, additional features may be added to the tiled display device 10A described below in accordance with some embodiments. In accordance with some other embodiments, some of the features of the tiled display device 10A may be replaced or omitted.

In accordance with some embodiments of the present disclosure, the tiled display device 10A may include a liquid-crystal display (LCD), a light-emitting diode (LED), a quantum dot, fluorescence, and phosphor, other suitable display media, or a combination thereof, but it is not limited thereto. In accordance with some embodiments, the light-emitting diode display device may include, for example, an organic light-emitting diode (OLED), a quantum dot light-emitting diode (QLED), and a mini light-emitting diode (mini LED), or a micro light-emitting diode (micro LED), but it is not limited thereto.

As shown in FIG. 1A, in accordance with some embodiments, the tiled display device 10A may include a first substrate 100 and a second substrate 200, and the second substrate 200 may be disposed adjacent to the first substrate 100. In some embodiments, the first substrate 100 may include a main region 100m, an edge region 100e, and an extension region 100ex. The edge region 100e connects between the main region 100m and the extension region 100ex. In some embodiments, the second substrate 200 may include a main region 200m, an edge region 200e, and an extension region 200ex. The edge region 200e connects between the main region 200m and the extension region 200ex. In some embodiments, the edge region 100e and the edge region 200e are adjacent to each other. In some embodiments, the edge region 100e and the edge region 200e may be used as a bendable region or a region where the first substrate 100 and the second substrate 200 are connected. In some embodiments, the extension region 100ex and the extension region 200ex may be bent below the first substrate 100 and the second substrate 200. The definitions of the extension region 100ex, the extension region 200ex, the edge region 100e, the edge region 200e, the main region 100m, and the main region 200m will be further explained in FIG. 1B.

In addition, the tiled display device 10A may include a plurality of light-emitting units 300, and the light-emitting units 300 may be disposed on the first substrate 100 and the second substrate 200. In some embodiments, in the normal direction of the first substrate 100 or the second substrate 200 (e.g., the Z direction shown in the figure), a portion of the light-emitting unit 300 may overlap with the main region 100m or the main region 200m and may not overlap with the edge region 100e or the edge region 200e; and a portion of the light-emitting unit 300 may partially overlap with the main region 100m or the main region 200m and may partially overlap with the edge region 100e of the first substrate 100 or the edge region 200e of the second substrate 200.

In some embodiments, one light-emitting unit 300 may include or correspond to one pixel 301, but the present disclosure is not limited thereto. In accordance with some embodiments, one light-emitting unit 300 may include or correspond to a plurality of pixels 301. In addition, the pixel 301 may include one or more subpixels. As shown in FIG. 1A, in some embodiments, one light-emitting unit 300 may include one pixel 301, and the pixel 301 may include, for example, three sub-pixels, i.e. sub-pixel 301a, sub-pixel 301b, and sub-pixel 301c. For example, in some embodiments, the sub-pixel 301a, sub-pixel 301b, and sub-pixel 301c may be red, green, and blue sub-pixels that are arranged in a suitable manner, but the present disclosure is not limited thereto. In some other embodiments, one pixel 301 may include red, green, blue, or white sub-pixels, or sub-pixels having other suitable colors, but the present disclosure is not limited thereto. In addition, in some embodiments, the sub-pixel 301a, sub-pixel 301b, and sub-pixel 301c may be the dies of light-emitting diodes that emit light of different colors, or the dies of light-emitting diode that emit light of the same color.

Moreover, a pitch $P_1$ may exist between two pixels 301. In detail, the term "pitch" may refer to a distance between an edge (e.g., the left-side edge) of a subpixel (e.g., sub-pixel 301a) and the same side edge (e.g., the left-side edge) of the next or the nearest same type subpixel (e.g., another subpixel 301a). In some embodiments, the "pitch" described above may be defined by sub-pixels that emit light of the same color. The "light of the same color" means that a wavelength difference between the maximum peaks in the spectra of the two light sources is between −5 nm to 5 nm, but the present disclosure is not limited thereto. As shown in FIG. 1A, in accordance with some embodiments of the present disclosure, the light-emitting unit 300 may include one pixel 301, and the pixel 301 may include three subpixels. The "pitch" described above may be, for example, a distance between the left-side edge of a sub-pixel (e.g., sub-pixel 301a) in one light-emitting unit 300 and the left-side edge of the same type sub-pixel (e.g., another sub-pixel 301a) in another adjacent light-emitting unit 300.

In addition, as shown in FIG. 1A, in accordance with some embodiments, the light-emitting unit 300 may include a plurality of connection pads 303. The connection pads 303 may be disposed on the first substrate 100 and the second substrate 200, and the connection pads 303 may be disposed between the pixel 301 and first substrate 100, or between the pixel 301 and the second substrate 200. The connection pad 303 may provide electrical connection between the light-emitting unit 300 and the first substrate 100 and the second substrate 200. Specifically, in some embodiments, a layout layer (not illustrated) of various wirings or electronic circuits may be disposed on the edge region 100e of the first substrate 100 or the edge region 200e of the second substrate 200, or the front surfaces (e.g., the extension region 100ex or the extension region 200ex) or the rear surfaces (e.g., the main region 100m or the main region 200m) of the first substrate 100 and the second substrate 200. In addition, the layout layer (not illustrated) may be electrically connected to the light-emitting unit 300 through the connection pads 303.

It should be understood that, in order to clearly illustrate the positional relationship of the light-emitting units 300 and the connection region between the first substrate 100 and the second substrate 200, the first substrate 100 and the second substrate 200 are drawn separately. That is, the state before the first substrate 100 and the second substrate 200 are tiled (joined) is illustrated. In addition, it should be understood that although only the first substrate 100 and the second substrate 200 are illustrated in the drawings, the tiled display device 10A may include any suitable amount of the substrates as needed in accordance with some embodiments, but the present disclosure is not limited thereto.

Figure 1B:
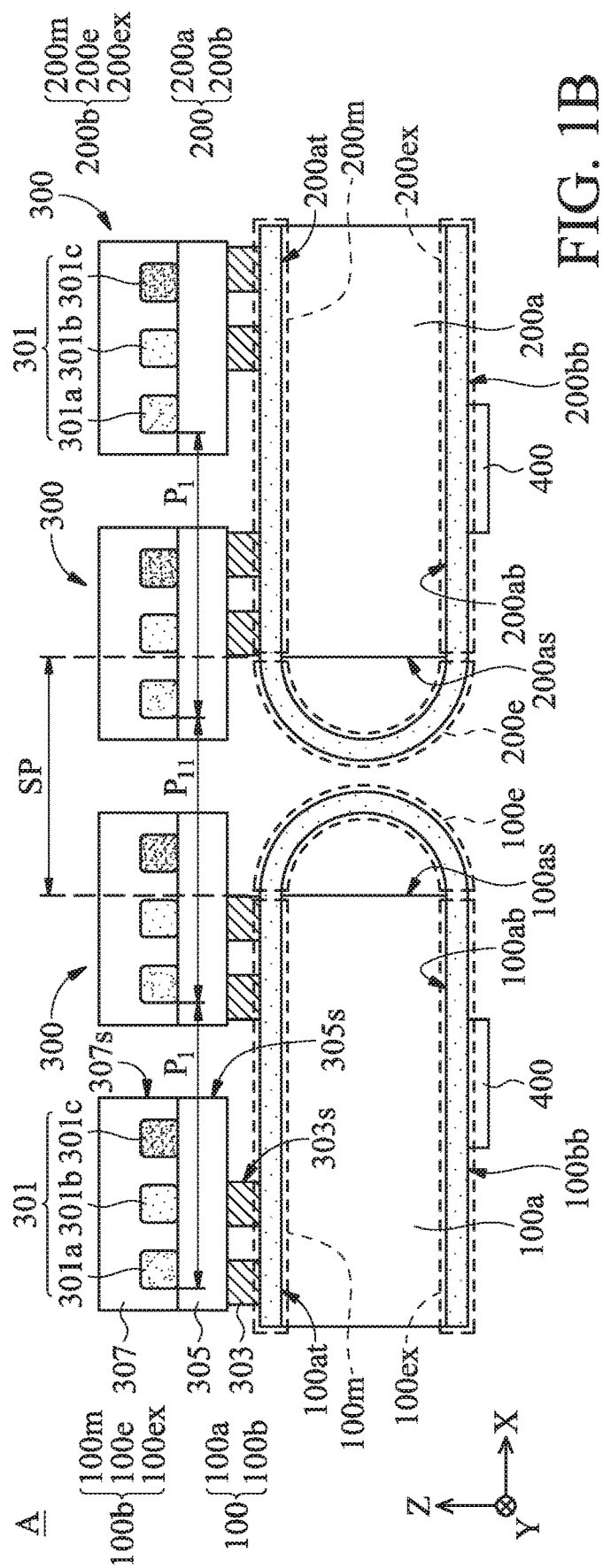
FIG. 1B is an enlarged cross-sectional diagram of the region A in FIG. 1A in accordance with some embodiments of the present disclosure.

Next, refer to FIG. 1B, which is an enlarged cross-sectional diagram of the edge region 100e, the edge region 200e, the extension region 100ex and extension region 200ex in the region A in FIG. 1A after the first substrate 100 and the second substrate 200 are tiled (joined) in accordance with some embodiments of the present disclosure. The structure of the tiled display device 10A at the connection position is further explained as follows. As shown in FIG. 1B, the first substrate 100 may include a first main substrate 100a and a first flexible substrate 100b, and the first flexible substrate 100b may be disposed on the first main substrate 100a. The second substrate 200 may include a second main substrate 200a and a second flexible substrate 200b, and the second flexible substrate 200b may be disposed on the second main substrate 200a. The first main substrate 100a may have an upper surface 100at, a lower surface 100ab, and an edge 100as. In some embodiments, the first flexible substrate 100b may extend from the upper surface 100at to the lower surface 100ab. In some embodiments, the first flexible substrate 100b may be optionally not in contact with the edge 100as.

Furthermore, the second main substrate 200a may have an upper surface 200at, a lower surface 200ab, and an edge 200as. In some embodiments, the second flexible substrate 200b may extend from the upper surface 200at to the lower surface 200ab. In some embodiments, the second flexible substrate 200b may not be in contact with the edge 200as.

In some embodiments, the first main substrate 100a and the second main substrate 200a may be a flexible substrate, a rigid substrate, or a combination thereof. In one embodiment, the material of the first main substrate 100a and the second main substrate 200a may include, but is not limited to, glass, quartz, sapphire, ceramic, plastic, other suitable substrate materials, or a combination thereof. In one embodiment, the material of the plastic substrate may include, but is not limited to, polyimide (PI), polyethylene terephthalate (PET), polycarbonate (PC), other suitable materials, or a combination thereof. In one embodiment, the material of the glass substrate may include, but is not limited to, silicon (Si), silicon carbide (SiC), gallium nitride (GaN), silicon dioxide ($SiO_2$), other suitable materials, or a combination thereof. In addition, in some embodiments, the first main substrate 100a and the second main substrate 200a may include a metal-glass fiber composite plate or a metal-ceramic composite plate, but they are not limited thereto. Moreover, the material of the first main substrate 100a may be the same as or different from the material of the second main substrate 200a.

In some embodiments, the first flexible substrate 100b and the second flexible substrate 200b may include a material having flexible characteristics. For example, in some embodiments, the material of the first flexible substrate 100b and the second flexible substrate 200b may include, but is not limited to, polyimide (PI), polyethylene terephthalate (PET), polycarbonate (PC), other suitable materials, or a combination thereof. In addition, the material of the first flexible substrate 100b may be the same as or different from the material of the second flexible substrate 200b.

As described above, in some embodiments, the first substrate 100 may include the main region 100m, the extension region 100ex, and the edge region 100e. Furthermore, the main region 100m is the region of the first flexible substrate 100b that is adjacent to the upper surface 100at of the first main substrate 100a and overlaps the upper surface 100at of the first main substrate 100a in the normal direction of the first main substrate 100a (e.g., the Z direction shown in the figure). The extension region 100ex is the region of first flexible substrate 100b that is adjacent to the lower surface 100ab of the first main substrate 100a and overlaps the lower surface 100ab of the first main substrate 100a in the normal direction of the first main substrate 100a. In addition, the edge region 100e is the region of the first flexible substrate 100b excluding the main region 100m and the extension region 100ex.

As described above, in some embodiments, the second substrate 200 may include the main region 200m, the extension region 200ex, and the edge region 200e. Furthermore, the main region 200m is the region of the second flexible substrate 200b that is adjacent to the upper surface 200at of the second main substrate 200a and overlaps the upper surface 200at of the second main substrate 200a in the normal direction of the second main substrate 200a (e.g., the Z direction shown in the figure). The extension region 200ex is the region of the second flexible substrate 200b that is adjacent to the lower surface 200ab of the second main substrate 200a and overlaps the lower surface 200ab of the second main substrate 200a in the normal direction of the second main substrate 200a. In addition, the edge region 200e is the region of the second flexible substrate 200b excluding the main region 200m and the extension region 200ex.

As shown in FIG. 1B, the light-emitting units 300 may be disposed on the first flexible substrate 100b, and a portion of the light-emitting unit 300 may overlap the upper surface 100at, and another portion of the light-emitting unit 300 may protrude from the upper surface 100at or the edge 100as of the first main substrate 100a. In other words, in some embodiments, a portion of the light-emitting units 300 may overlap the edge region 100e in the normal direction of the first main substrate 100a. On the other hand, in accordance with some embodiments, the light-emitting unit 300 may also be disposed on the second flexible substrate 200b, and a portion of the light-emitting unit 300 may overlap the upper surface 200at, and another portion of the light-emitting unit 300 may protrude from the upper surface 200at or the edge 200as of the second main substrate 200a. In other words, in some embodiments, a portion of the light-emitting unit 300 may overlap the edge region 200e in the normal direction of the second main substrate 200a.

Furthermore, in some embodiments, at least a portion of the first flexible substrate 100b may be disposed between the first substrate 100 and the second substrate 200. Specifically, in some embodiments, at least a portion of the first flexible substrate 100b may be disposed between the edge 100as of the first main substrate 100a and the edge 200as of the second main substrate 200a. In some embodiments, in the normal direction of the first main substrate 100a or the second main substrate 200a (e.g., the Z direction shown in the figure), a portion of the light-emitting unit 300 may overlap the first flexible substrate 100b that is disposed between the edge 100as and the edge 200as.

Similarly, in some embodiments, at least a portion of the second flexible substrate 200b may be disposed between the first substrate 100 and the second substrate 200, for example, between the edge 100as of the first main substrate 100a and the edge 200as of the second main substrate 200a.

As described above, in accordance with some embodiments, the light-emitting unit 300 may include one or more pixels 301, and the pixel 301 may include a suitable number of sub-pixels, such as sub-pixel 301a, sub-pixel 301b, and sub-pixel 310c. In this embodiment, the light-emitting unit 300 may include one pixel 301, and the pixel 301 may include three sub-pixels. In some embodiments, the sub-pixel 301a, the sub-pixel 301b, and the sub-pixel 310c are three dies of the light-emitting diodes.

In addition, as shown in FIG. 1B, in some embodiments, the light-emitting unit 300 may include a plurality of connection pads 303, and the connection pads 303 may be disposed on the first flexible substrate 100b and the second flexible substrate 200b. In some embodiments, the first flexible substrate 100b and the second flexible substrate 200b may include a layout layer (not illustrated) of various wirings or electronic circuits disposed thereon, and the layout layer (not illustrated) may be electrically connected to the light-emitting units 300 through the connection pads 303.

In some embodiments, the connection pad 303 may be electrically connected to an anode electrode or a cathode electrode of the die of the light-emitting unit 300. Specifically, in this embodiment, the light-emitting unit 300 has three sub-pixels, i.e. sub-pixel 301a, sub-pixel 301b, and sub-pixel 310c. The three connection pads 303 may be electrically connected to the anode electrodes of the dies of the sub-pixel 301a, sub-pixel 301b, and sub-pixel 310c, and one connection pad 303 may be electrically connected to the cathode electrode of the dies of the sub-pixel 301a, sub-pixel 301b, and sub-pixel 310c. That is, the three sub-pixels 301a, 301b, and 310c may have a common cathode, but the manner of polarity connection is not limited thereto.

In some embodiments, the connection pad 303 may include a conductive material. In some embodiments, the connection pad 303 may include a metal conductive material, a transparent conductive material, or a combination thereof. In some embodiments, the metal conductive material may include, but is not limited to, copper (Cu), aluminum (Al), molybdenum (Mo), silver (Ag), tin (Sn), tungsten (W), gold (Au), chromium (Cr), nickel (Ni), platinum (Pt), copper alloy, aluminum alloy, molybdenum alloy, silver alloy, tin alloy, tungsten alloy, gold alloy, chromium alloy, nickel alloy, platinum alloy, other suitable metal materials, or a combination thereof. In some embodiments, the transparent conductive material may include a transparent conductive oxide (TCO). For example, the transparent conductive oxide may include, but is not limited to, indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), other suitable transparent conductive materials, or a combination thereof.

In some embodiments, a chemical vapor deposition (CVD) process, a physical vapor deposition (PVD) process, an electroplating process, an electroless plating process, other suitable processes, or a combination thereof may be used to form the connection pad 303, but the present disclosure is not limited thereto.

In addition, in accordance with some embodiments, the light-emitting unit 300 may further include an intermediate substrate 305 disposed between the pixel 301 and the connection pad 303, and a protective layer 307 disposed above the intermediate substrate 305. In some embodiments, the pixel 301 may be electrically connected to the connection pad 303 through a via (not illustrated) that penetrates through the intermediate substrate 305, but it is not limited thereto. In some embodiments, the protective layer 307 may optionally cover the top surface and the side surface of the pixel 301.

In some embodiments, the intermediate substrate 305 may be a flexible substrate, a rigid substrate, or a combination thereof. In one embodiment, the intermediate substrate 305 may include, but is not limited to, a glass substrate, a ceramic substrate, a plastic substrate, other suitable substrate materials, or a combination thereof. In one embodiment, the material of the intermediate substrate 305 may include, but is not limited to, epoxy resins, polymerized siloxanes (silicone), polyimide (PI), and polyethylene terephthalate (PET), polycarbonate (PC), other suitable materials, or a combination thereof. In one embodiment, the material of the glass substrate may include, but is not limited to, silicon (Si), silicon carbide (SiC), gallium nitride (GaN), silicon dioxide ($SiO_2$), other suitable materials, or a combination thereof. In addition, in some embodiments, the intermediate substrate 305 may include a printed circuit board (PCB), a metal-glass fiber composite plate, or a metal-ceramic composite plate, but it is not limited thereto.

In some embodiments, the protective layer 307 may include, but is not limited to, organic materials, inorganic materials, other suitable packaging materials, or a combination thereof. In some embodiments, the inorganic material may include, but is not limited to, silicon nitride, silicon oxide, silicon oxynitride, aluminum oxide, or other suitable materials. In some embodiments, the organic material may include, but is not limited to, epoxy resins, silicone resins, acrylic resins (such as polymethylmetacrylate (PMMA), benzocyclobutene (BCB), polyimide, polyester, polydimethylsiloxane (PDMS), tetrafluoroethylene-perfluoroalkoxy vinyl ether copolymer (polyfluoroalkoxy, PFA), other suitable materials, or a combination thereof.

In addition, in accordance with some embodiments, the protective layer 307 may have a function of wavelength conversion, for example, a light source generated by the pixel 301 may be converted into light having a specific wavelength range (specific color). In some embodiments, the protective layer 307 may further include particles having a wavelength conversion function, such as phosphors, quantum dot (QD) materials, organic fluorescent materials, other suitable materials, or a combination thereof, but it is not limited thereto.

In some embodiments, the protective layer 307 may be formed by the chemical vapor deposition process, a spin coating process, a printing process, other suitable processes, or a combination thereof.

In accordance with some embodiments, the packaging method of the light-emitting unit 300 may include surface-mount devices (SMD) packaging of light-emitting diodes, chip-on-board (COB) packaging of light-emitting diodes, packaging of micro light-emitting diodes or flip-chip light-emitting diodes, packaging of organic light-emitting diodes, other suitable packaging methods, or a combination thereof, but it is not limited thereto.

In addition, as shown in FIG. 1B, in accordance with some embodiments, the tiled display device 10 may further include a driving element 400, and the driving element 400 may be disposed on the extension region 100ex of the first flexible substrate 100b. In some embodiments, the driving element 400 may be in contact with the lower surface 100bb of the first flexible substrate 100b. In some embodiments, the driving element 400 may also be disposed on the extension region 200ex of the second flexible substrate 200b, and may be in contact with the lower surface 200bb of the second flexible substrate 200b.

In some embodiments, the driving element 400 may include an active driving element, a passive driving element, or a combination thereof. For example, the active driving element may include a thin-film transistor (TFT), but it is not limited thereto. For example, the thin film transistor may include a switching transistor, a driving transistor, a reset transistor, or other thin film transistors. In some embodiments, the thin film transistor may include at least one semiconductor layer. The semiconductor layer may include, but is not limited to, amorphous silicon, such as low-temperature polysilicon (LTPS), metal oxide, other suitable materials, or a combination thereof. The metal oxide may include, but is not limited to, indium gallium zinc oxide (IGZO), indium zinc oxide (IZO), indium gallium zinc tin oxide (IGZTO), other suitable materials, or a combination thereof.

Furthermore, in the embodiments where the driving element is a passive driving element, the driving element may be controlled by, for example, an integrated circuit (IC) or a microchip, but the present disclosure is not limited thereto.

Figure 1C:
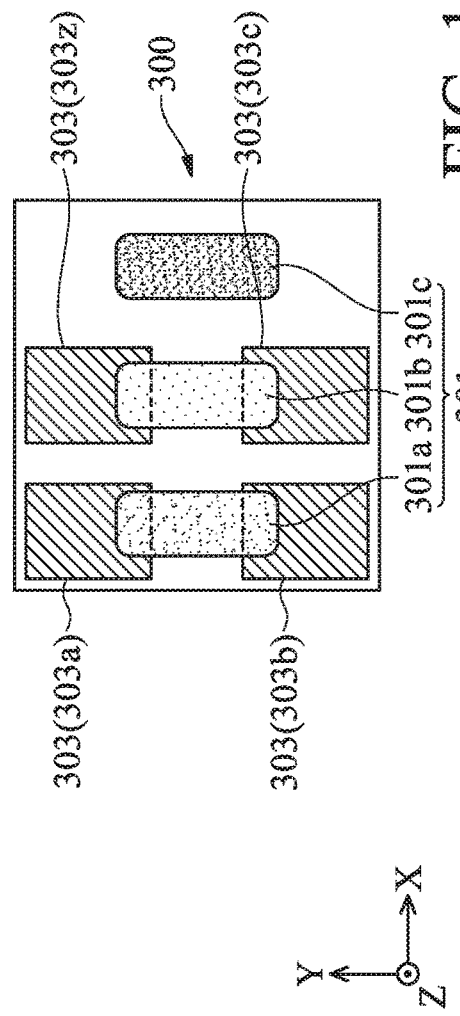
FIG. 1C is a top-view diagram of the light-emitting unit in accordance with some embodiments of the present disclosure.

Next, refer to both FIG. 1B and FIG. 1C. FIG. 1C is a top-view diagram of the light-emitting unit 300 in accordance with some embodiments of the present disclosure. The diagram only illustrates the pixel 301 and the connection pads 303. As shown in FIG. 1B and FIG. 1C, in some embodiments, the connection pad 303 may not overlap with the edge region 100e or the edge region 200e in the normal direction (e.g., the Z direction shown in the figure) of the first main substrate 100a. Specifically, in some embodiments, the sidewall 303s of the connection pad 303 may not be aligned with the sidewall of the light-emitting unit 300 (e.g., the sidewall 305s of the intermediate substrate 305 or the sidewall 307s of the protective layer 307). In addition, the sidewall 303s, the sidewall 305s, and the sidewall 307s respectively refer to the side wall of the connection pad 303, the side wall of the intermediate substrate 305, and the side wall of the protective layer 307 that are closer to the connection position of the first substrate 100 and the second substrate 200.

In some embodiments, the connection pads 303 may be shifted, that is, the connection pads 303 may be unevenly disposed at the four corners of the light-emitting unit 300, but each sub-pixels 301a, 301b, and 301c of the light-emitting unit 300 is electrically connected to the corresponding connection pad 303 through the wirings in the intermediate substrate 305. For example, the sub-pixel 301c may be electrically connected to the two connection pads (i.e. connection pad 303c and connection pad 303z) through the wirings in the intermediate substrate 305. The connection pad 303z may be a common cathode, therefore the sub-pixel 301a and sub-pixel 301b may also be electrically connected to the connection pad 303z. In some embodiments, the connection pads 303 of the light-emitting units 300 other than those partially overlapping the edge region 100e may be uniformly disposed at four corners of the light-emitting unit 300 or uniformly disposed at the periphery of the light-emitting unit 300, but the present disclosure is not limited thereto. In some embodiments, some sub-pixels (e.g., the sub-pixel 301c shown in the figure) may protrude from the edge 100as of the first main substrate 100a and partially overlap the edge region 100e in the normal direction of the first main substrate 100a (e.g., the Z direction shown in the figure). Moreover, in some embodiments, some sub-pixels (e.g., the sub-pixel 301a shown in the figure) may protrude from the edge 200as of the second main substrate 200a and partially overlap the edge region 200e in the normal direction of the second main substrate 200a (e.g., the Z direction shown in the figure).

In addition, in some embodiments, the connection pad 303 may not protrude from the edge 100as of the first main substrate 100a in the normal direction of the first main substrate 100a (e.g., the Z direction shown in the figure). In some embodiments, the connection pad 303 may not protrude from the edge 200as of the second main substrate 200a in the normal direction of the second main substrate 200a (e.g., the Z direction shown in the figure).

It should be noted that in accordance with some embodiments of the present disclosure, a portion of the light-emitting unit 300 that is near the connection position may protrude from the edge 100as of the first main substrate 100a or the edge 200as of the second main substrate 200a. In general, tiled display devices, the sidewall of the light-emitting unit 300 is aligned with the edge 100as or the edge 200as, or the light-emitting unit 300 does not protrude from the edge 100as or the edge 200as. Compared with general tiled display devices, the configuration of the light-emitting units 300 and the connection pads 303 provided in the present disclosure renders at least a portion of the edge region 100e of the first flexible substrate 100b and at least a portion of the edge region 200e of the second flexible substrate 200b hidden under the light-emitting units 300. Therefore, the bendable space SP of the first flexible substrate 100b and the second flexible substrate 200b at the connection position may be increased, and the risk of disconnection of the wirings at the bending positions of the first flexible substrate 100b or the second flexible substrate 200b may be reduced. Specifically, the bendable space SP of the first flexible substrate 100b and the second flexible substrate 200b at the connection position of the substrates may be the minimum distance between the edge 100as of the first main substrate 100a and the edges 200as of the second main substrate 200a. Alternatively, in accordance with some embodiments of the present disclosure, the configuration of the light-emitting unit 300 and its connection pads 303 may reduce the difference between the pitch P1 of the pixels 301 in the main region 100m and the pitch P11 of the pixels 301 that are adjacent to the connection position of the substrates, thereby reducing the visual gap at the connection position or improving the display quality.

Figure 2A:
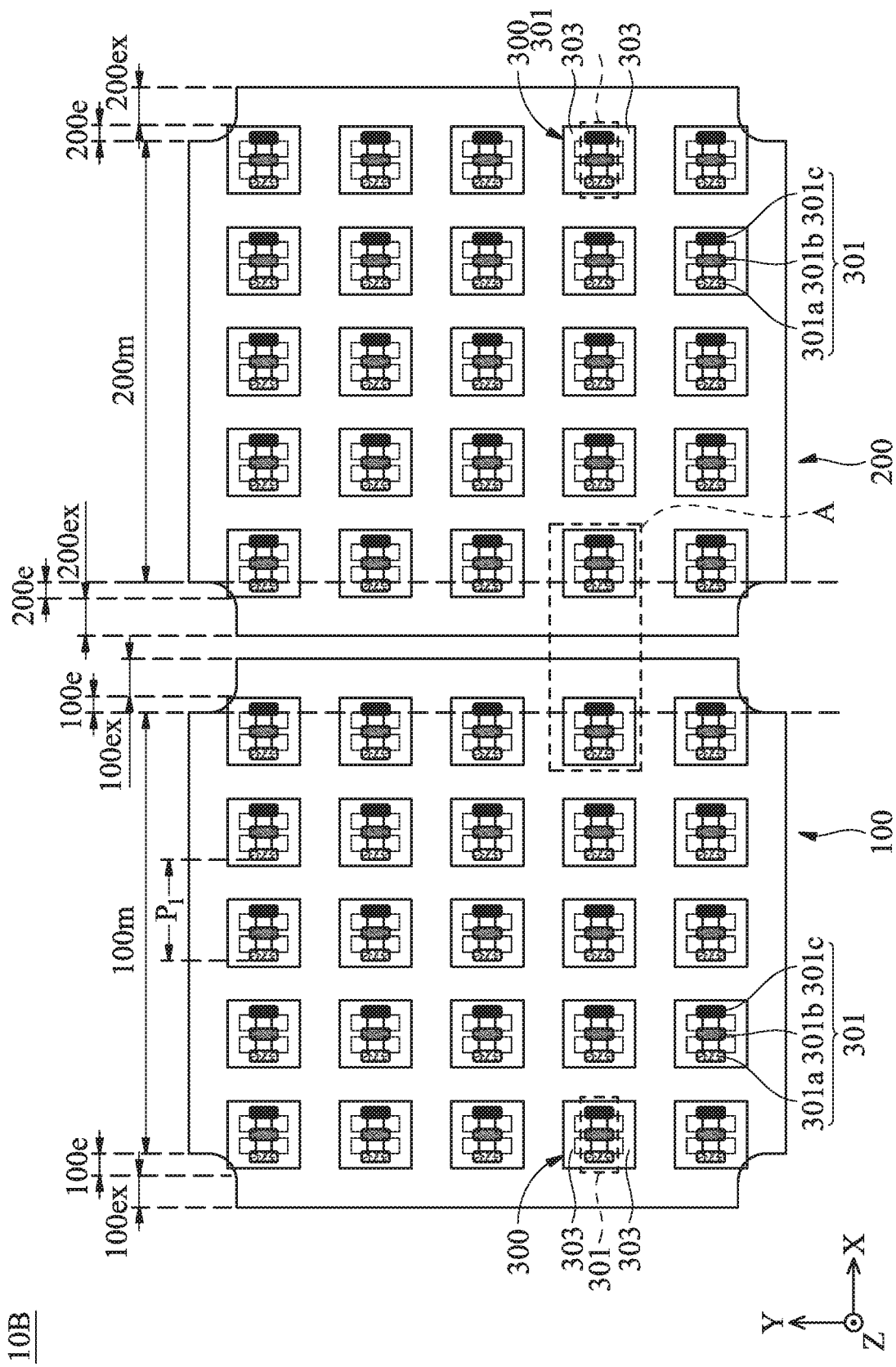
FIG. 2A is a top-view diagram of the tiled display device in accordance with some embodiments of the present disclosure.

Next, refer to FIG. 2A, which is a top-view diagram of a tiled display device 10B in accordance with some other embodiments of the present disclosure. It should be understood that the same or similar components or elements in above and below contexts are represented by the same or similar reference numerals. The materials, manufacturing methods and functions of these components or elements are the same or similar to those described above, and thus will not be repeated herein.

As shown in FIG. 2A, in accordance with some embodiments, the first substrate 100 may include at least one edge region 100e. In other words, the first substrate 100 may include a plurality of regions that can serve as the bendable connection position. In some embodiments, the second substrate 200 may include at least one edge region 200e. In other words, the second substrate 200 may include a plurality of regions that may serve as the bendable connection position. Specifically, in this embodiment, the first substrate 100 and the second substrate 200 may have, for example, four edge regions 100e and four edge regions 200e, respectively. The four sides of the first substrate 100 and the second substrate 200 may be tiled with other substrates. In addition, in this embodiment, the light-emitting units 300 provided on the first substrate 100 and the light-emitting units 300 provided on the second substrate 200 may have the same configuration of connection pads 303.

Figure 2B:
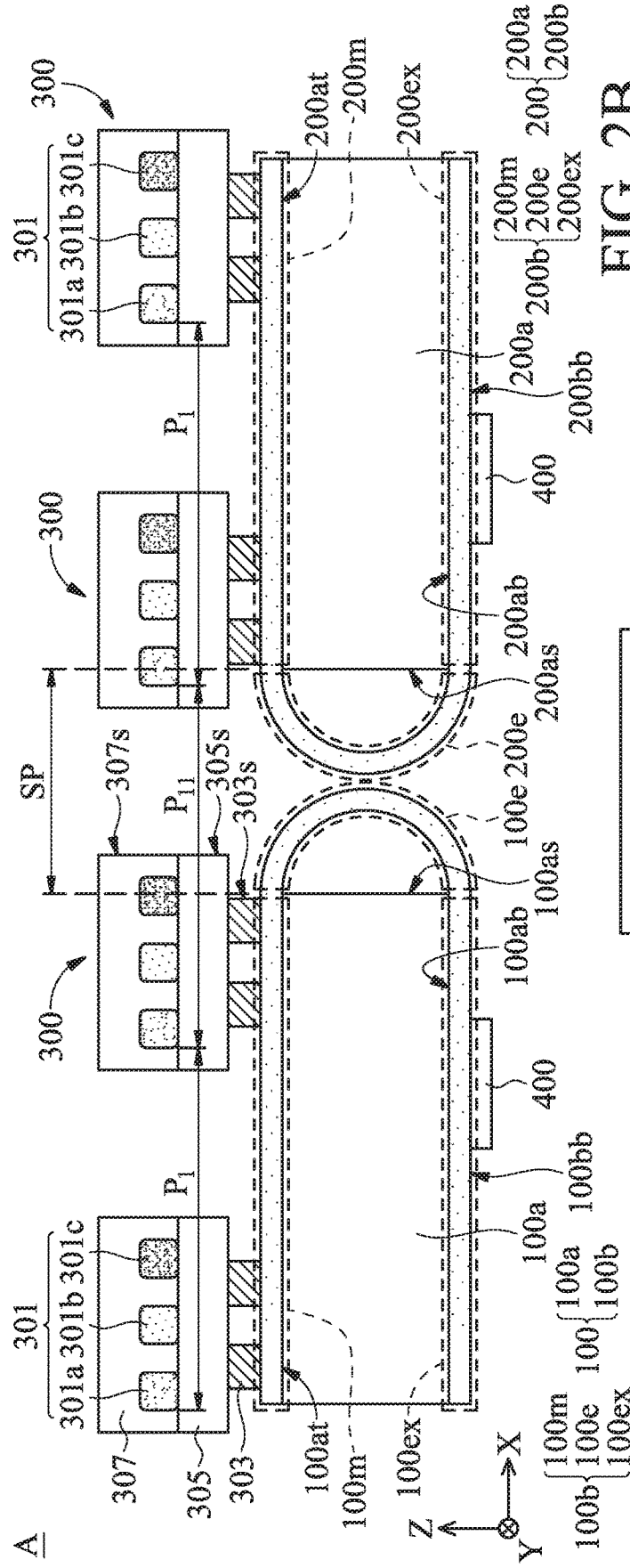
FIG. 2B is an enlarged cross-sectional diagram of the region A in FIG. 2A in accordance with some embodiments of the present disclosure.
Figure 2C:
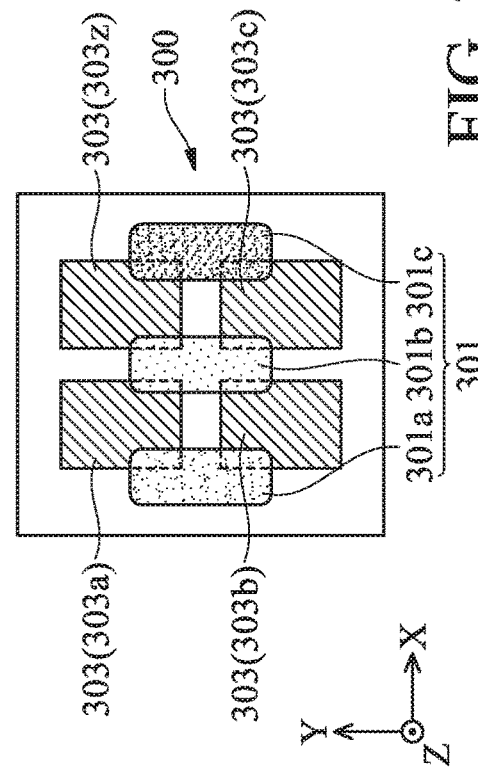
FIG. 2C is a top-view diagram of the light-emitting unit in accordance with some embodiments of the present disclosure.

Specifically, refer to FIG. 2B and FIG. 2C. FIG. 2B is an enlarged cross-sectional diagram of the edge region 100e, the edge region 200e, the extension region 100ex and extension region 200ex in the region A in FIG. 2A. FIG. 2C is a top-view diagram of the light-emitting unit 300 in accordance with some embodiments of the present disclosure. The diagram only illustrates the pixel 301 and the connection pads 303. As shown in FIG. 2B and FIG. 2C, in this embodiment, the connection pads 303 may be disposed near the center of the light-emitting unit 300, and the connection pads 303 may not be disposed at the four corners of the light-emitting unit 300. In this embodiment, the sidewall 303s of the connection pad 303 may not be aligned with the sidewall of the light-emitting unit 300 (e.g., the sidewall 305s of the intermediate substrate 305 or the sidewall 307s of the protective layer 307). In addition, the connection pad 303 may not overlap with the edge region 100e or the edge region 200e in the normal direction of the first main substrate 100a (e.g., the Z direction shown in the figure), and a portion of the light-emitting unit 300 may protrude from the edge 100as of the first main substrate 100a.

In some embodiments, in the normal direction of the first main substrate 100a (e.g., the Z direction shown in the figure), a portion of the sub-pixel that is adjacent to the edge region 100e (e.g., the sub-pixel 301c shown in the figure) may overlap the main region 100m, and another portion of which may protrude from the edge 100as of the first main substrate 100a and overlap with the edge region 100e. Furthermore, in some embodiments, in the normal direction of the second main substrate 200a (e.g., the Z direction shown in the figure), a portion of the sub-pixel that is adjacent to the edge region 100e (e.g., the sub-pixel 301a shown in the figure) may overlap the main region 200m, and another portion of which may protrude from the edge 200as of the second main substrate 200a and overlap the edge region 200e.

In addition, in some embodiments, the connection pads 303 may not protrude from the edge 100as of the first main substrate 100a in the normal direction of the first main substrate 100a (e.g., the Z direction shown in the figure). That is, the connection pads 303 may be substantially disposed on the main region 100m. In some embodiments, the connection pads 303 may not protrude from the edge 200as of the second main substrate 200a in the normal direction of the second main substrate 200a (e.g., the Z direction shown in the figure). That is, the connection pads 303 may be substantially disposed on the main region 200m.

It should be noted that in this embodiment, a portion of the light-emitting unit 300 that is near the connection position may protrude from the edge 100as of the first main substrate 100a or the edge 200as of the second main substrate 200a. The configuration of the light-emitting units 300 and the connection pads 303 described above may increase the bendable space SP of the first flexible substrate 100b and the second flexible substrate 200b at the connection position of the substrates, thereby reducing risk of disconnection of the wirings at the bending position of the first flexible substrate 100b or the second flexible substrate 200b. Alternatively, the configuration of the light-emitting unit 300 and its connection pads 303 may reduce the difference between the pitch $P_1$ of the pixels 301 in the main region 100m and the pitch $P_{11}$ of the pixels 301 that are adjacent to the connection position of the substrates, thereby reducing the visual gap at the connection position or improving the display quality.

In addition, in this embodiment, the connection pads 303 are all disposed near the center of the light-emitting unit 300. Therefore, in cases where the first substrate 100 and the second substrate 200 have several edge regions 100e and edge regions 200e, only one type of light-emitting unit 300 may be provided, which may reduce the cost and difficulty of manufacturing.

Figure 3:
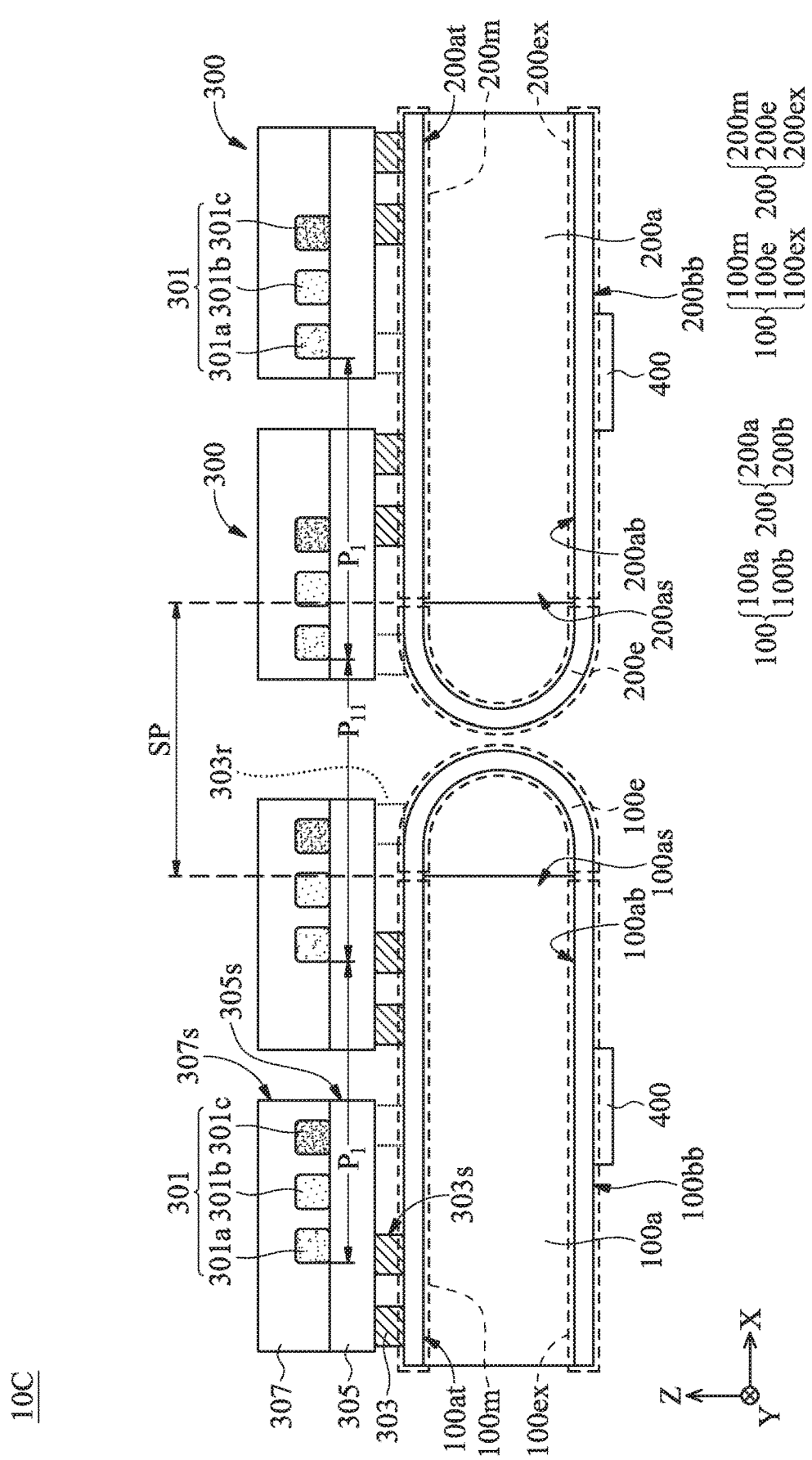
FIG. 3 is a partial cross-sectional diagram of the tiled display device in accordance with some embodiments of the present disclosure.

Next, refer to FIG. 3, which is a partial cross-sectional diagram of a tiled display device 10C in accordance with some embodiments of the present disclosure. Specifically, FIG. 3 illustrates a partial structure of the tiled display device 10C at the connection position of the first substrate 100 and the second substrate 200. As shown in FIG. 3, in this embodiment, a maximum distance between the pixel 301 and the connection pad 303 in the X direction may be increased by increasing the packaging volume of the light-emitting unit 300. For example, compared with the pixel 301, the connection pads 303 may be farther away from the connection position of the first substrate 100 and the second substrate 200. In this embodiment, the volume of the light-emitting unit 300 may be increased by increasing the volume of the intermediate substrate 305 and the protective layer 307, so that a portion of the light-emitting unit 300 may protrude from the edge 100as of the first main substrate 100a.

Similarly, in this embodiment, the sidewall 303s of the connection pad 303 may not be aligned with the sidewall of the light-emitting unit 300 (e.g., the sidewall 305s of the intermediate substrate 305 or the sidewall 307s of the protective layer 307). The connection pads 303 may be disposed away from the side of the first substrate 100 or the side of the second substrate 200, or the connection pads 303 may be disposed at a position away from the connection position of the first substrate 100 and the second substrate 200.

In some embodiments, in the normal direction of the first main substrate 100a (e.g., the Z direction shown in the figure), some sub-pixels (e.g., the sub-pixel 301c and the sub-pixel 301b shown in the figure) may protrude from the edge 100as of the first main substrate 100a and overlap the edge region 100e. Furthermore, in some embodiments, in the normal direction of the second main substrate 200a (e.g., the Z direction shown in the figure), some sub-pixels (e.g., the sub-pixel 301a and the sub-pixel 301b shown in the figure) may protrude from the edge 200as of the second main substrate 200a and overlap the edge region 200e.

In addition, in some embodiments, the connection pads 303 may not protrude from the edge 100as of the first main substrate 100a in the normal direction of the first main substrate 100a (e.g., the Z direction shown in the figure). That is, the connection pads 303 may be substantially disposed on the main region 100m. In some embodiments, the connection pads 303 may not protrude from the edge 200as of the second main substrate 200a in the normal direction of the second main substrate 200a (e.g., the Z direction shown in the figure). That is, the connection pads 303 may be substantially disposed on the main region 200m.

In addition, as shown in FIG. 3, in some embodiments, the light-emitting unit 300 may further include a redundant connection pad 303r, and at least a portion of the redundant connection pad 303r may protrude from the edge 100as of the first main substrate 100a. In some embodiments, the redundant connection pad 303r is a connection pad that is not electrically connected to the pixel 301 or the circuit (not illustrated) on the first flexible substrate 100b. In some embodiments, the redundant connection pad 303r of the light-emitting unit 300 may be in contact with the redundant connection pad (not illustrated) disposed on the edge region 100e of the first flexible substrate 100b to increase the structural strength or stability of the light-emitting unit 300. For example, when the light-emitting unit 300 is fixed on the substrate 100, the redundant connection pad may provide a uniform pressure distribution. In some embodiments, the material of the redundant connection pad 303r may be the same or similar to the material of the connection pad 303 as described above, and thus will not be repeated herein.

In this embodiment, a portion of the light-emitting unit 300 that is near the connection position may protrude from the edge 100as of the first main substrate 100a or the edge 200as of the second main substrate 200a, which renders the edge region 100e of the first flexible substrate 100b and the edge region 200e of the second flexible substrate 200b hidden under the light-emitting units 300. Therefore, the bendable space SP of the first flexible substrate 100b and the second flexible substrate 200b at the connection position may be increased, and the risk of disconnection of the wirings at the bending positions of the first flexible substrate 100b or the second flexible substrate 200b may be reduced. Alternatively, in this embodiments, the configuration of the light-emitting unit 300 and its connection pads 303 may reduce the difference between the pitch $P_1$ of the pixels 301 in the main region 100m and the pitch $P_{11}$ of the pixels 301 that are adjacent to the connection position of the substrates, thereby reducing the visual gap at the connection position or improving the display quality.

Figure 4A:
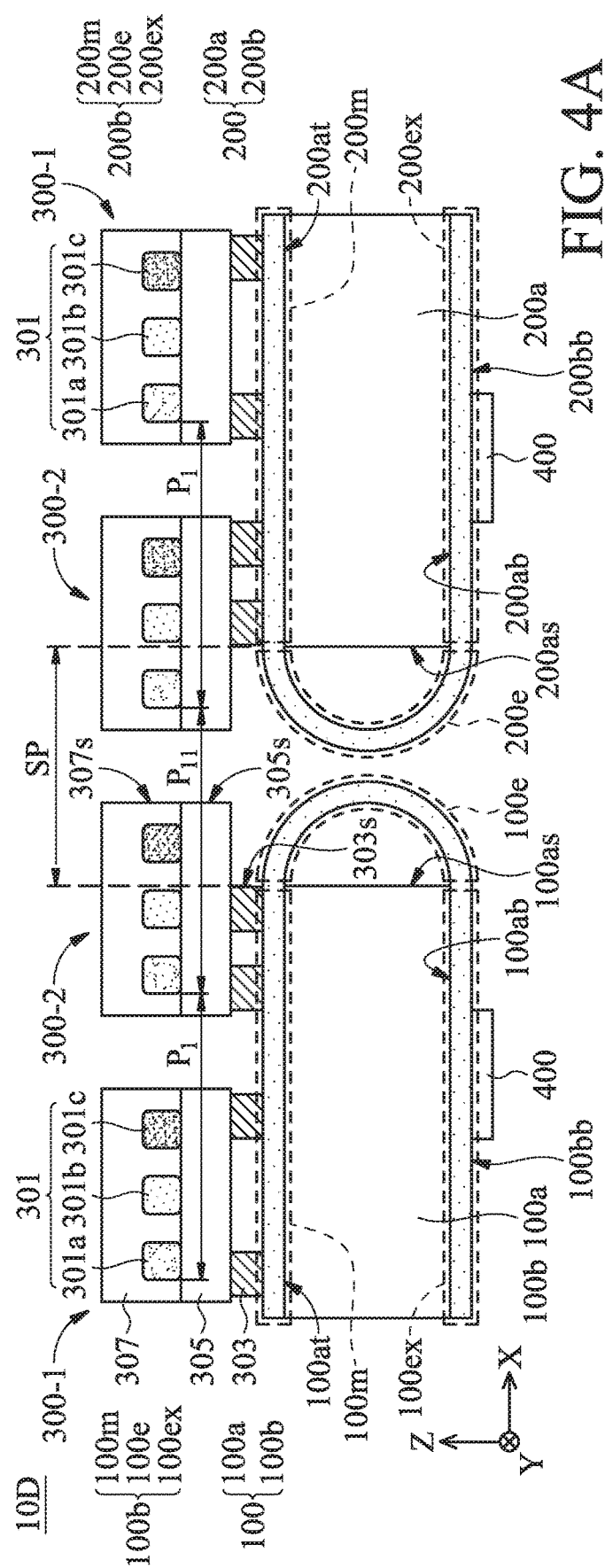
FIG. 4A is a partial cross-sectional diagram of the tiled display device in accordance with some embodiments of the present disclosure.
Figure 4B:
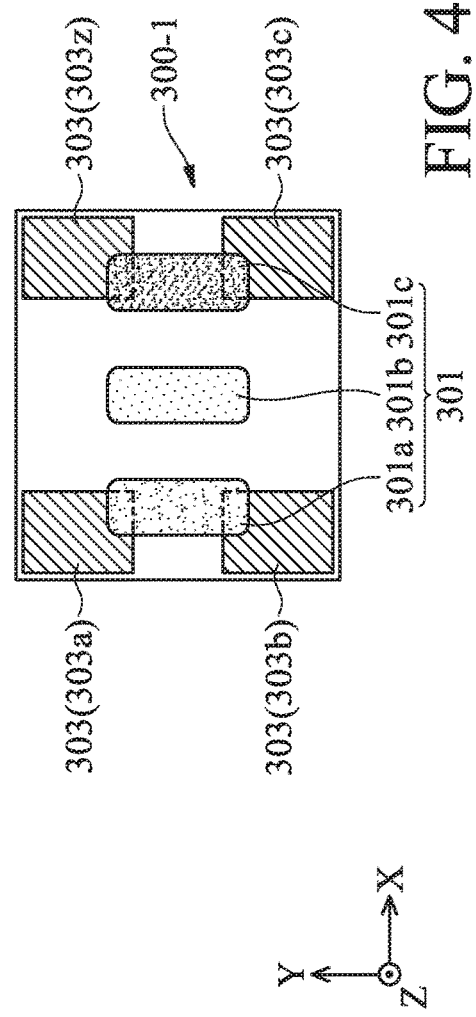
FIG. 4B is a top-view diagram of the light-emitting unit in accordance with some embodiments of the present disclosure.

Next, refer to FIG. 4A and FIG. 4B. FIG. 4A is a partial cross-sectional diagram of a tiled display device 10D in accordance with some embodiments of the present disclosure. Specifically, FIG. 4A illustrates a partial structure of the tiled display device 10D at the connection position of the first substrate 100 and the second substrate 200. FIG. 4B is a top-view diagram of some light-emitting units 300 in this embodiment, and the diagram only illustrates the pixel 301 and the connection pads 303.

As shown in FIG. 4A, in some embodiments, the configurations of the connection pads 303 of different light-emitting units 300 (labeled as light-emitting unit 300-1 and light-emitting unit 300-2 for clear illustration) may be different. In some embodiments, the configuration of the connection pads 303 of the light-emitting unit 300-1 located on the main region 100m may be different from the configuration of the connection pads 303 of the light-emitting unit 300-2 located on the edge area 100e.

Specifically, in this embodiment, the configuration of the connection pads 303 corresponding to the light-emitting unit 300-1 is as shown in FIG. 4B. The connection pads 303 may be substantially disposed at four corners of the light-emitting unit 300. In some embodiments, some of the sub-pixels (e.g., the sub-pixel 301b) of the light-emitting unit 300-1 do not overlap the connection pads 303 in the normal direction (e.g., the Z direction shown in the figure) of the first main substrate 100a. Furthermore, in this embodiment, the configuration of the connection pads 303 corresponding to the light-emitting unit 300-2 may be as shown in the above FIG. 1C, but the present disclosure is not limited thereto.

It should be understood that in accordance with some embodiments, in the tiled display device 10D, the configurations of the connection pads 303 of some of the light-emitting units 300 may be the same, and the configurations of the connection pads 303 of some light-emitting units 300 may different. In addition, in accordance with some embodiments, in the tiled display device 10D, the packaging structures (e.g., the volume of the package) of some of the light-emitting units 300 may be the same, and the packaging structures of some of the light-emitting units 300 may be different.

Figure 5:
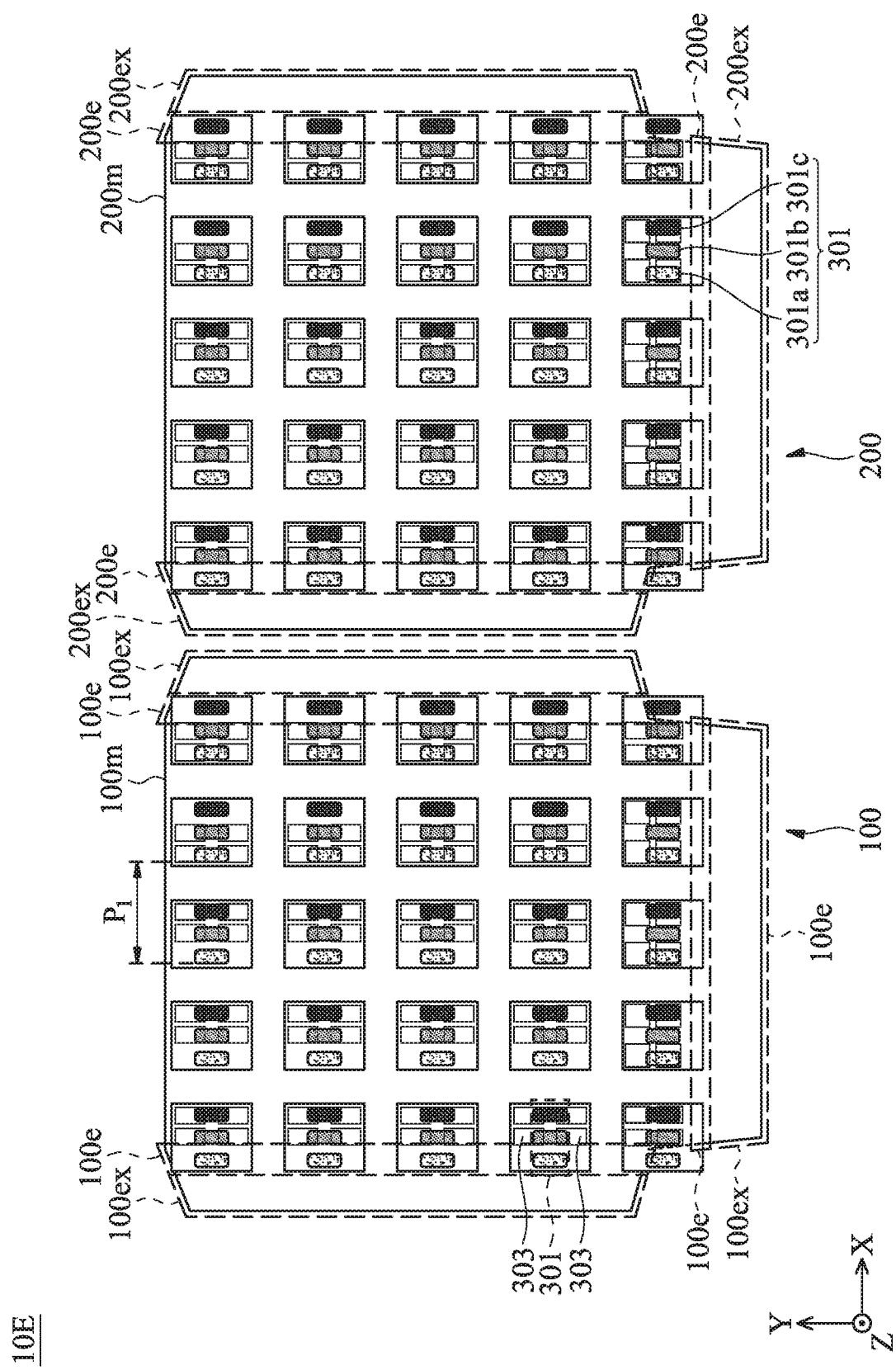
FIG. 5 is a top-view diagram of the tiled display device in accordance with some embodiments of the present disclosure.

Next, refer to FIG. 5, which is a top-view diagram of a tiled display device 10E in accordance with some other embodiments of the present disclosure. As shown in FIG. 5, in some embodiments, the light-emitting unit 300 may have different connection pads 303 configurations according to different positions on the first substrate 100.

For example, in this embodiment, the connection pads 303 of the light-emitting unit 300 located on the edge region 100e are substantially as shown in FIG. 1C. That is, the connection pads 303 may be gathered toward a particular direction. Furthermore, in this embodiment, the light-emitting units 300 located between the two edge regions 100e may be gathered toward one corner, but the present disclosure is not limited thereto.

Figure 6A:
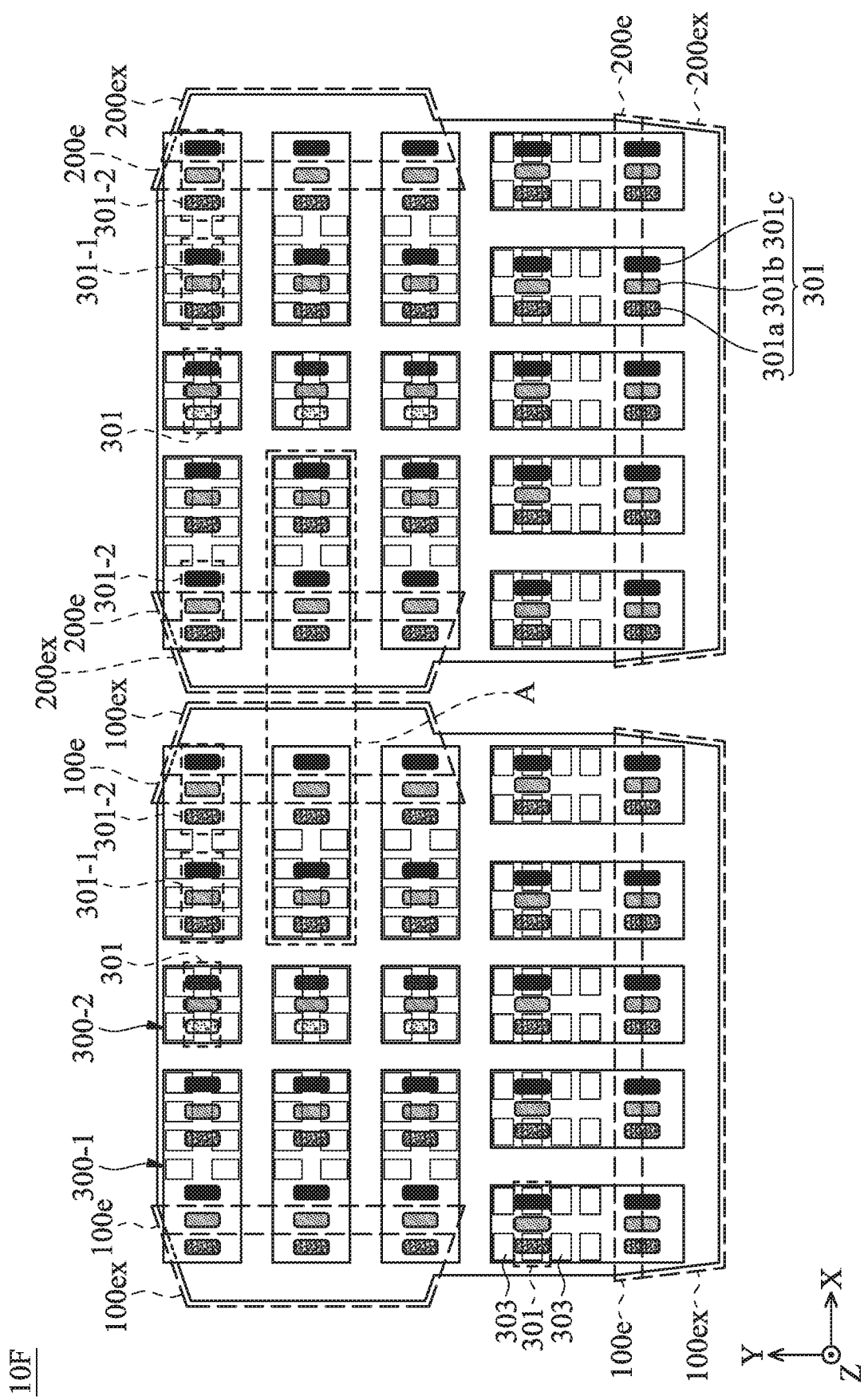
FIG. 6A is a top-view diagram of the tiled display device in accordance with some embodiments of the present disclosure.

Next, refer to FIG. 6A, which is a top-view diagram of a tiled display device 10F in accordance with some embodiments of the present disclosure. As shown in FIG. 6A, in some embodiments, the sides of the first substrate 100 or the second substrate 200 may partially include the edge region 100e, the extension region 100ex, the edge region 200e, or the extension region 200ex, as the bendable areas for connection. Furthermore, in this embodiment, the tiled display device 10F may include the light-emitting units 300 having different packaging structures. For example, the light-emitting unit 300-1 shown in the figure may include two sets of pixels 301 (labeled as pixel 301-1 and pixel 301-2), and the light-emitting unit 300-2 may include one set pixel 301 (labeled as pixel 301-1). In addition, in some embodiments, the configuration of the connection pads 303 in the light-emitting unit 300-1 may be different from the configuration of the connection pads 303 in the light-emitting unit 300-2.

Figure 6B:
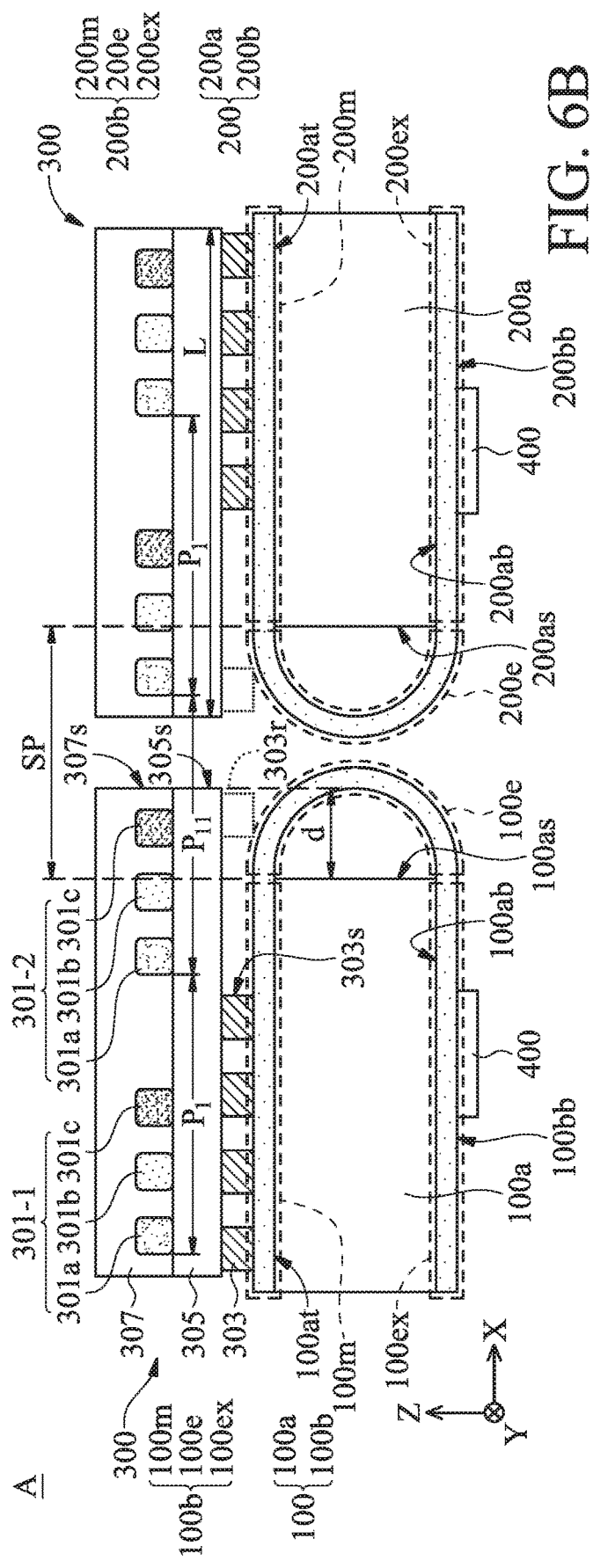
FIG. 6B is an enlarged cross-sectional diagram of the region A in FIG. 6A in accordance with some embodiments of the present disclosure.
Figure 6C:
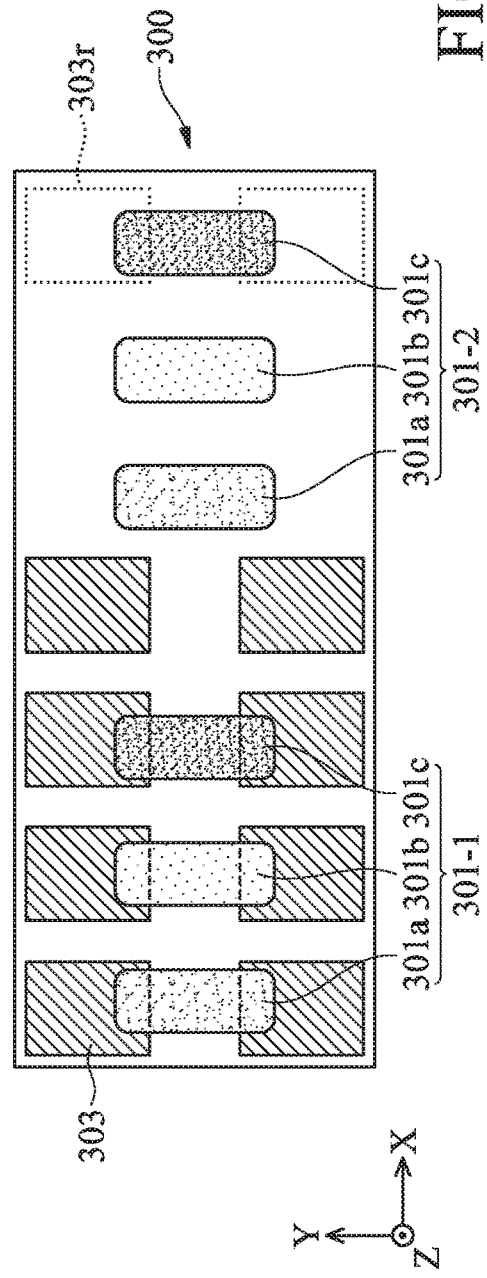
FIG. 6C is a top-view diagram of the light-emitting unit in accordance with some embodiments of the present disclosure.

Refer to FIG. 6B and FIG. 6C. FIG. 6B is an enlarged cross-sectional diagram of the region A in FIG. 6A. FIG. 6C is a top-view diagram of the light-emitting unit 300 in this embodiment, and the diagram only illustrates the pixel 301 and the connection pads 303. In this embodiment, the light-emitting unit 300 may include the pixel 301-1 and the pixel 301-2. The pixel 301-1 may be located on the first main substrate 100a, and a portion of the pixel 301-2 may protrude from the edge 100as of the first main substrate 100a. Specifically, in this embodiment, by increasing the packaging volume of the light-emitting unit 300, the light-emitting unit 300 may accommodate a plurality of pixels 301 (e.g., the pixel 301-1 and the pixel 301-2), and the connection pads 303 may be farther away from the connection position of the first substrate 100 and the second substrate 200 compared with the pixel 301 (pixel 301-2).

In this embodiment, the volume of the light-emitting unit 300 may be increased by increasing the volume of the intermediate substrate 305 and the protective layer 307, so that a portion of the light-emitting unit 300 may protrude from the edge 100as of the first main substrate 100a. Specifically, in some embodiments, a portion of the light-emitting unit 300 may protrude from the edge 100as for a distance d. In some embodiments, the light-emitting unit 300 has a maximum length L in the X direction, and the length L may be, for example, a distance from one side of the intermediate substrate 305 to the other side in the x direction. In some embodiments, the distance d may be less than or equal to L/2, or in a range between L/5 and L/3.

It should be understood that if the distance d is too large, the light-emitting unit 300 may not be stably mounted on the first flexible substrate 100b; on the other hand, if the distance d is too small, the bendable space SP of the first flexible substrate 100b and the second flexible substrate 200b at the connection position may be insufficient. Furthermore, in accordance with some embodiments, the distance d may refer to a maximum distance between the edge 100as of the first main substrate 100a and the side wall of the light-emitting unit 300 (e.g., the sidewall 305s of the intermediate substrate 305 or the sidewall 307s of the protective layer 307) in a direction perpendicular to the normal direction of the first main substrate 100a (e.g., the X direction shown in the figure).

In addition, in accordance with some embodiments of the present disclosure, an optical microscopy (OM), a scanning electron microscope (SEM), a film thickness profiler (α-step), an ellipsometer, or other suitable methods may be used to measure the thickness or length of the elements, or distance between the elements, but the present disclosure is not limited thereto.

As shown in FIG. 6B and FIG. 6C, in this embodiment, the sidewall 303s of the connection pad 303 may not be aligned with the sidewall of the light-emitting unit 300 (e.g., the sidewall 305s of the intermediate substrate 305 or the sidewall 307s of the protective layer 307), and the connection pads 303 may be disposed far from the connection position of the first substrate 100 and the second substrate 200. In addition, in accordance with some embodiments, the configuration of the connection pads 303 corresponding to the pixel 301-1 may be different from the configuration of the connection pads 303 corresponding to the pixel 301-2.

Furthermore, in this embodiment, the light-emitting unit 300 may further include the redundant connection pads 303r, and at least a portion of the redundant connection pad 303r may protrude from the edge 100as of the first main substrate 100a. In some embodiments, the redundant connection pad 303r may not be electrically connected to the pixel 301 or the circuit (not illustrated) on the first flexible substrate 100b. In some embodiments, the redundant connection pad 303r of the light-emitting unit 300 may be in contact with the redundant connection pad (not illustrated) disposed on the edge region 100e of the first flexible substrate 100b to increase structural strength or stability.

In this embodiment, a portion of the light-emitting unit 300 that is near the connection position may protrude from the edge 100as of the first main substrate 100a or the edge 200as of the second main substrate 200a, thereby increasing the bendable space SP of the first flexible substrate 100b and the second flexible substrate 200b at the connection position. Therefore, the risk of disconnection of the wirings at the bending positions of the first flexible substrate 100b or the second flexible substrate 200b may be reduced. Moreover, in this embodiment, the configuration described above may maintain the consistency of the pitch $P_1$ between the pixels 301, even at the connection position of the substrates.

Figure 7:
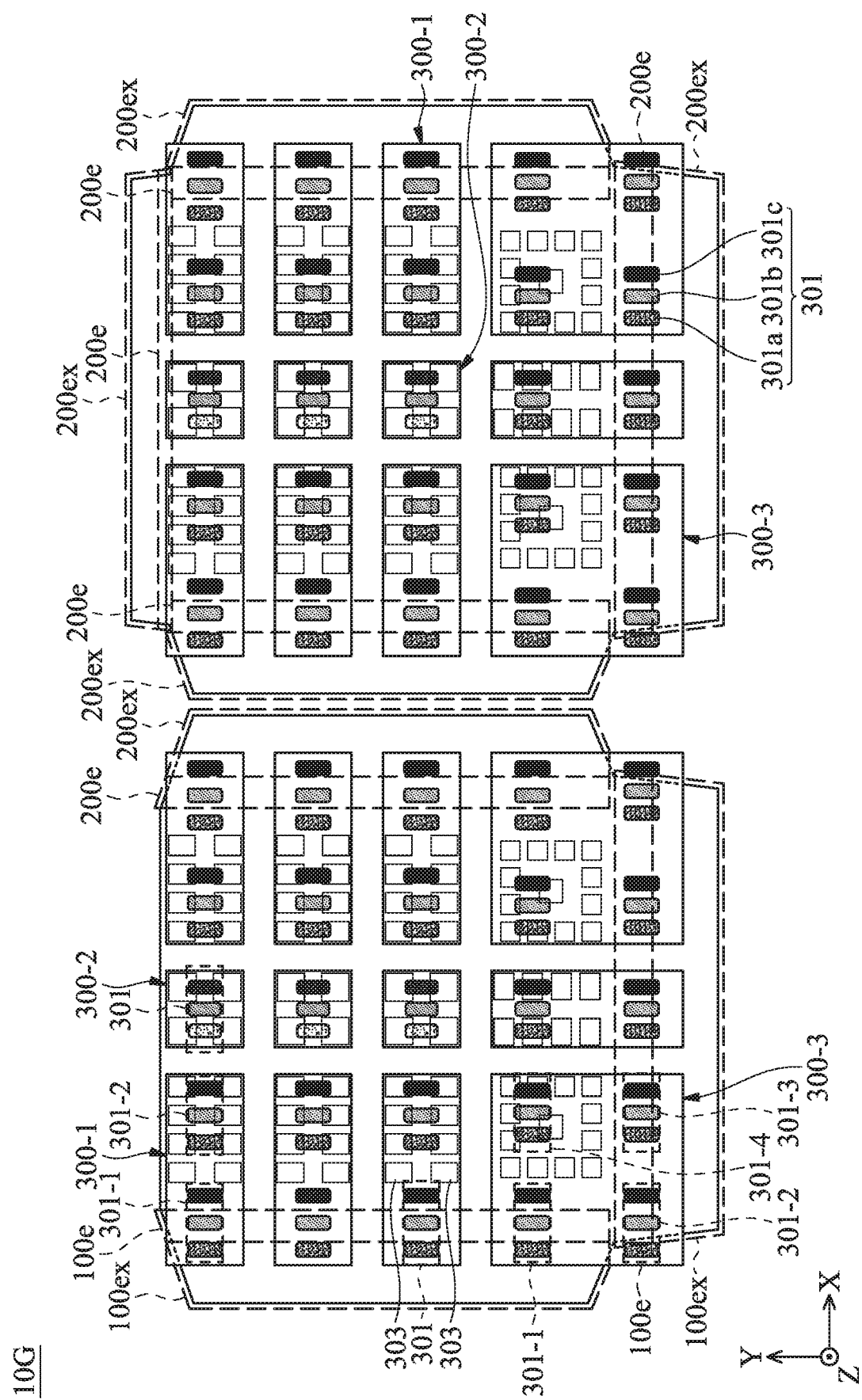
FIG. 7 is a top-view diagram of the tiled display device in accordance with some embodiments of the present disclosure.

Next, refer to FIG. 7, which is a top-view diagram of a tiled display device 10G in accordance with some other embodiments of the present disclosure. As shown in FIG. 7, in some embodiments, the tiled display device 10G may include the light-emitting units 300 having different packaging structures. For example, the light-emitting unit 300-1 shown in the figure may include two sets of pixels 301 (labeled as pixel 301-1 and pixel 301-2), the light-emitting unit 300-2 may include one set of pixel 301 (labeled as pixel 301-1), and the light-emitting unit 300-3 may include four sets of pixels 301 (labeled as pixel 301-1, pixel 301-2, pixel 301-3, and pixel 301-4).

In addition, in some embodiments, the configurations of the connection pads 303 in the light-emitting unit 300-1, the light-emitting unit 300-2, and light-emitting unit 300-3 may be different from each other. Specifically, in some embodiments, the configuration of the connection pads 303 in the light-emitting unit 300-1 may be as shown in FIG. 6C, and the configuration of the connection pads 303 in the light-emitting unit 300-2 may be as shown in FIG. 4B, but the present disclosure is not limited thereto. As described above, in this embodiment, the light-emitting unit 300-3 may include four sets of pixels 301, and the pixel 301 may include, for example, 12 sub-pixels. As shown in FIG. 7, the light-emitting unit 300-3 may include 13 connection pads 303, one of the connection pads 303 (e.g., the connection pad 303 located at the center) may be electrically connected to the common cathode of the sub-pixel, but the present disclosure is not limited thereto.

Figure 8A:
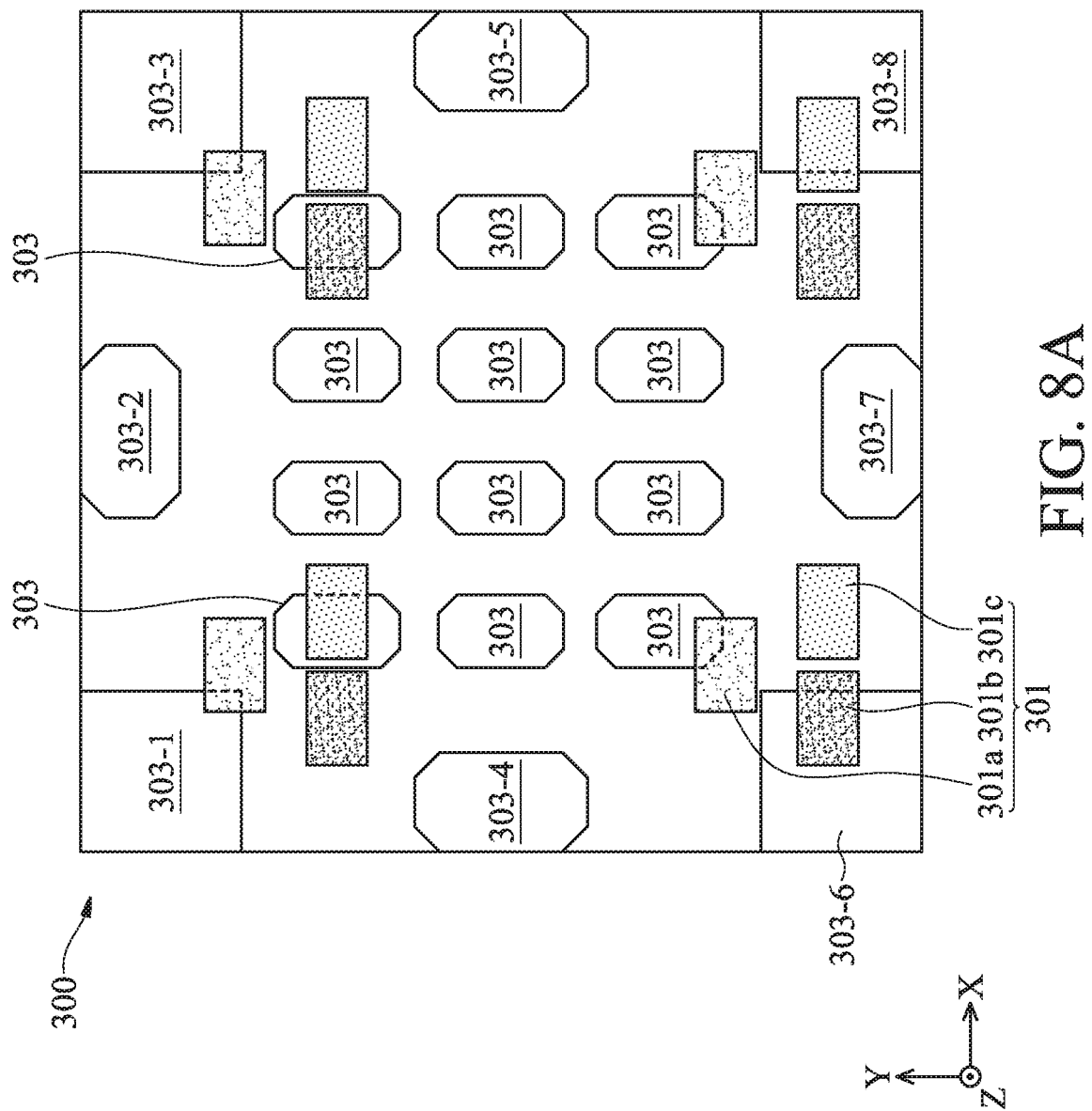
FIG. 8A is a top-view diagram of the light-emitting unit in accordance with some embodiments of the present disclosure.

Next, refer to FIG. 8A, which is a top-view diagram of the light-emitting unit 300 in accordance with some embodiments of the present disclosure, and the diagram only illustrates the pixel 301 and the connection pads 303. As shown in FIG. 8A, in some embodiments, the light-emitting unit 300 may include four sets of pixels 301, and each pixel 301 may include three sub-pixels (sub-pixel 301a, sub-pixel 301b, and sub-pixel 301c). That is, the light-emitting unit 300 may include 12 sub-pixels. In this embodiment, the anode electrodes of the twelve sub-pixels may be respectively electrically connected to the twelve connection pads 303 located in the central area, so as to respectively control the twelve sub-pixels. Furthermore, in this embodiment, the eight connection pads 303-1, 303-2, 303-3, 303-4, 303-5, 303-6, 303-7, and 303-8 provided in the peripheral area may be electrically connected to each other, and at least one of them may be electrically connected to the common cathode electrode of the twelve sub-pixels.

In addition, in some embodiments, at least one of the connection pads 303-1, 303-2, 303-3, 303-4, 303-5, 303-6, 303-7, and 303-8 may be electrically connected to the driving element 400 disposed on the lower surface 100*bb* of the first flexible substrate 100*b*. It should be noted that in this embodiment, according to the edge area 100*e* at different positions or the bendable area at different orientations, the connection pad that is electrically connected to the cathode electrode or the driving element 400 may be suitably selected from the connection pads 303-1, 303-2, 303-3, 303-4, 303-5, 303-6, 303-7, and 303-8. Therefore, the flexibility for adjusting the wiring of the substrate may be improved or the cost for producing a variety of molds may be reduced. In some embodiments, at least one of the above eight connection pads may protrude from the edge 100*as* of the first main substrate 100*a*. In some embodiments, the connection pads 303-1, 303-2, 303-3, 303-4, 303-5, 303-6, 303-7, and 303-8 that are not used or are not electrically connected may be regarded as redundant connection pads.

In addition, it should be understood that although the connection pad 303 shown in the drawings has a rectangular or octagonal shape, the present disclosure is not limited thereto. In some embodiments, the shape of the connection pad 303 may be adjusted according to actual needs. For example, the connection pad 303 may have a triangle, a square, a circle, a pentagon, a hexagon, an arbitrary polygon, other suitable shapes, or a combination thereof, but it is not limited thereto.

Figure 8B:
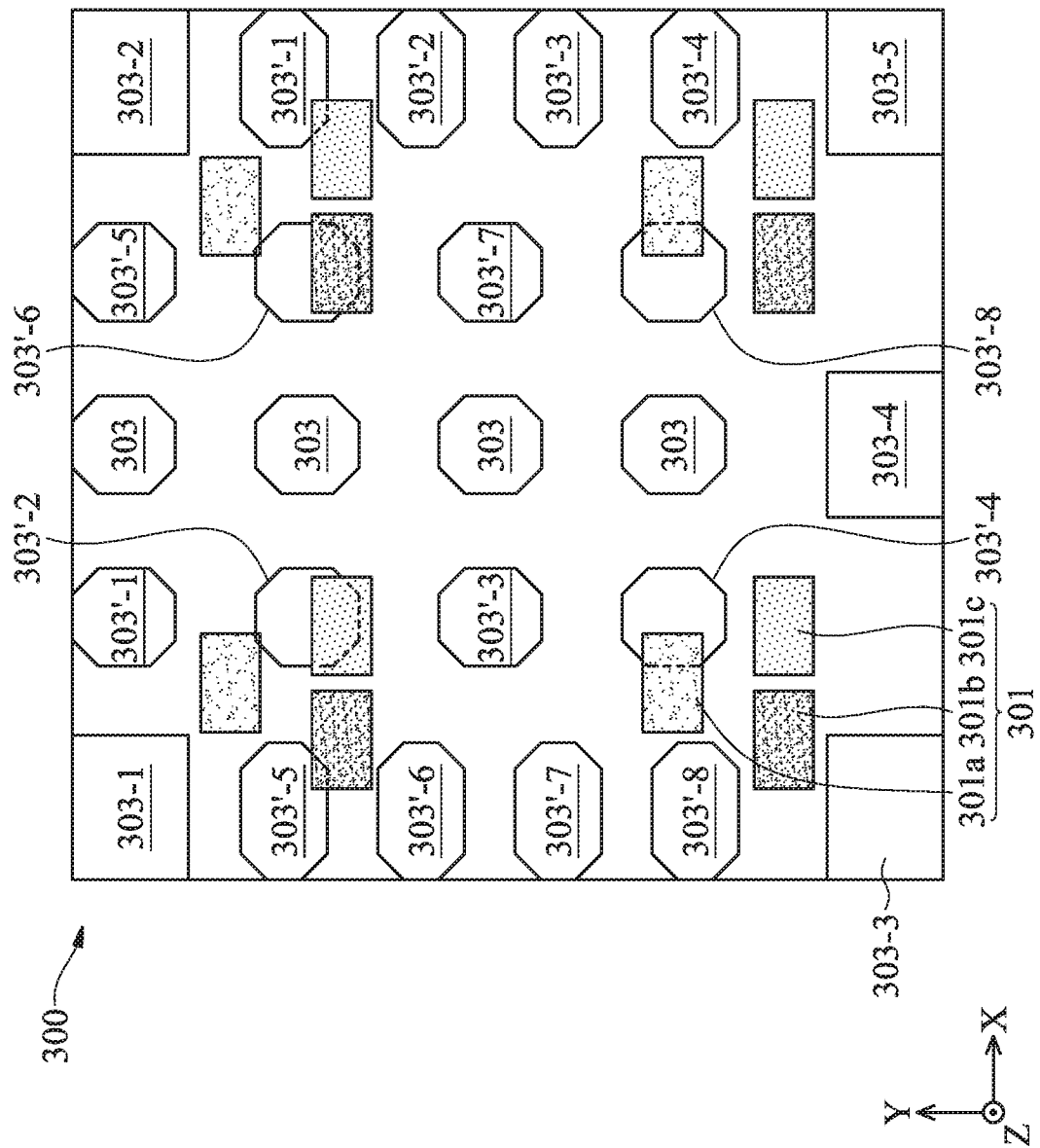
FIG. 8B is a top-view diagram of the light-emitting unit in accordance with some embodiments of the present disclosure.

Next, refer to FIG. 8B, which is a top-view diagram of the light-emitting unit 300 in accordance with some other embodiments of the present disclosure, and the diagram only illustrates the pixel 301 and the connection pads 303. As shown in FIG. 8B, in accordance with some embodiments, some of the connection pads 303 that are electrically connected to the anode electrode of the light-emitting unit 300 may be further divided into a plurality of connection pads, e.g., the connection pad 303'-1, 303'-2, 303'-3, 303'-4, 303'-5, 303'-6, 303'-7, and 303'-8. In some embodiments, the two connection pads 303'-1 may be electrically connected to each other, the two connection pads 303'-2 may be electrically connected to each other, the two connection pads 303'-3 may be electrically connected to each other, the two connection pads 303'-4 may be electrically connected to each other, the two connection pads 303'-5 may be electrically connected to each other, the two connection pads 303'-6 may be electrically connected to each other, the two connection pads 303'-7 may be electrically connected to each other, and the two connection pads 303'-8 may be electrically connected to each other. In some embodiments, the connection pads 303'-1, 303'-2, 303'-3, 303'-4, 303'-5, 303'-6, 303'-7, and 303'-8 may be electrically connected to different anode electrodes in the light-emitting unit 300. In some embodiments, the connection pads 303-1, 303-2, 303-3, 303-4, and 303-5 are electrically connected to each other, and at least one of them is electrically connected to the driving element 400. In some embodiments, the connection pads 303-1, 303-2, 303-3, 303-4, and 303-5 that are not used or are not electrically connected may be regarded as redundant connection pads. In some embodiments, at least one of the connection pads at the periphery of FIG. 8B may protrude from the edge 100*as* of the first main substrate 100*a*.

It should be noted that in this embodiment, according to the edge area 100*e* at different positions or the bendable area at different orientations, the connection pad that is electrically connected to the anode electrode may be suitably selected from the connection pads 303'-1, 303'-2, 303'-3, and 303'-4. Therefore, the flexibility for adjusting the wiring of the substrate may be improved or the cost for producing a variety of molds may be reduced. In some embodiments, the connection pads 303'-1, 303'-2, 303'-3, and 303'-4 that are not used or are not electrically connected may be regarded as redundant connection pads.

To summarize the above, in accordance with some embodiments of the present disclosure, the bendable area of the flexible substrates may be increased or the bending angle of the flexible substrate may be reduced by having the connection pads away from the bending area where the substrates are connected, or by changing the packaging structure of the light-emitting unit or the configuration of the connection pads. In accordance with some embodiments of the present disclosure, the risk of disconnection of the circuit in the bending area of the substrate may be reduced without affecting the pitch of the light-emitting units or the resolution of the panel, thereby improving the reliability of the tiled display device.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The features of the various embodiments can be used in any combination as long as they do not depart from the spirit and scope of the present disclosure. The scope of protection of present disclosure is subject to the definition of the scope of the appended claims.

What is claimed is:

1. A tiled display device, comprising:
a first substrate comprising a first main substrate and a first flexible substrate, wherein the first flexible substrate is disposed on the first main substrate;
a second substrate disposed adjacent to the first substrate; and
a light-emitting unit disposed on the first flexible substrate and comprising at least one pixel,
wherein a portion of the light-emitting unit protrudes from an edge of the first main substrate, and wherein the light-emitting unit further comprises a plurality of connection pads, an intermediate substrate disposed between the at least one pixel and the plurality of connection pads, and a protective layer disposed above the intermediate substrate.

2. The tiled display device as claimed in claim 1, wherein at least a portion of the first flexible substrate is disposed between the first main substrate and a second main substrate.

3. The tiled display device as claimed in claim 1, wherein at least one of the plurality of connection pads protrudes from the edge of the first main substrate.

4. The tiled display device as claimed in claim 3, wherein a sidewall of the at least one of the plurality of connection pads is not aligned with a sidewall of the light-emitting unit.

5. The tiled display device as claimed in claim 1, wherein at least two of the plurality of connection pads are electrically connected to each other.

6. The tiled display device as claimed in claim 1, the light-emitting unit comprising a first pixel and a second pixel, wherein the first pixel is located on the first main substrate, and a portion of the second pixel protrudes from the edge of the first main substrate.

7. The tiled display device as claimed in claim 1, the light-emitting unit comprising a first pixel, a second pixel and the plurality of connection pads that are disposed below the first pixel and the second pixel, wherein a configuration of the plurality of connection pads corresponding to the first pixel is different from a configuration of the plurality of connection pads corresponding to the second pixel.

8. The tiled display device as claimed in claim 1, one of the at least one pixel comprising a plurality of sub-pixels, wherein at least one of the plurality of sub-pixels protrudes from the edge of the first main substrate.

9. The tiled display device as claimed in claim 1, wherein a portion of the at least one pixel protrudes from the edge of the first main substrate.

10. The tiled display device as claimed in claim 8, wherein at least one of the plurality of sub-pixels does not overlap with the plurality of connection pads.

11. The tiled display device as claimed in claim 1, wherein a sidewall of at least one of the plurality of connection pads is not aligned with a sidewall of the intermediate substrate or a sidewall of the protective layer.

12. The tiled display device as claimed in claim 1, the plurality of connection pads comprising a redundant connection pad, wherein at least a portion of the redundant connection pad protrudes from the edge of the first main substrate.

13. The tiled display device as claimed in claim 12, wherein the redundant connection pad is not electrically connected to the at least one pixel.

14. The tiled display device as claimed in claim 1, wherein the first main substrate has a lower surface, the first flexible substrate further comprises an extension region, and wherein the extension region is adjacent to the lower surface and overlaps the lower surface in a normal direction of the first main substrate.

15. The tiled display device as claimed in claim 14, further comprising a driving element disposed on the extension region.

16. The tiled display device as claimed in claim 1, the first substrate comprising a main region, an edge region and an extension region, wherein the edge region connects between the main region and the extension region, and a portion of the light-emitting unit overlaps with the main region and does not overlap with the edge region.

17. The tiled display device as claimed in claim 16, wherein a portion of the light-emitting unit partially overlaps with the main region and partially overlaps with the edge region.

18. The tiled display device as claimed in claim 1, wherein the portion of the light-emitting unit protrude from the edge for a distance d, the light-emitting unit has a maximum length L, and a range of the distance d is less than or equal to L/2, or between L/5 and L/3.

* * * * *